(12) United States Patent
Hammerschmied et al.

(10) Patent No.: US 10,270,138 B2
(45) Date of Patent: Apr. 23, 2019

(54) BATTERY MODULE WITH A FIXTURE FOR A TEMPERATURE SENSITIVE ELEMENT

(71) Applicant: Samsung SDI Co., Ltd., Yongin-si, Gyeonggi-do (KR)

(72) Inventors: Helmut Hammerschmied, Graz (AT); Maximilian Hofer, Hartberg (AT); Urban Cotic, Lovrenc na Pohorju (SI)

(73) Assignee: Samsung SDI Co., Ltd., Yongin-si (KR)

( * ) Notice: Subject to any disclaimer, the term of this patent is extended or adjusted under 35 U.S.C. 154(b) by 127 days.

(21) Appl. No.: 15/625,847

(22) Filed: Jun. 16, 2017

(65) Prior Publication Data

US 2018/0115027 A1 Apr. 26, 2018

(30) Foreign Application Priority Data

Oct. 26, 2016 (EP) .................................... 16195706

(51) Int. Cl.
*H01M 10/48* (2006.01)
*H05K 1/18* (2006.01)
*H01M 10/42* (2006.01)
*H01M 2/04* (2006.01)
*H01M 2/34* (2006.01)
*B60L 11/18* (2006.01)
(Continued)

(52) U.S. Cl.
CPC ....... *H01M 10/486* (2013.01); *H01M 2/0473* (2013.01); *H01M 2/348* (2013.01);
(Continued)

(58) Field of Classification Search
CPC ........... H01M 10/486; H01M 10/4257; H01M 2010/4271; H01M 2200/10;
(Continued)

(56) References Cited

U.S. PATENT DOCUMENTS

| 6,288,386 B1 * | 9/2001 | Bowen | G02B 23/12 250/214 VT |
| 2007/0229656 A1 * | 10/2007 | Khait | A61B 1/041 348/77 |

(Continued)

FOREIGN PATENT DOCUMENTS

| JP | 5703458 B2 | 4/2015 |
| KR | 10-2015-0089483 A | 8/2015 |
| KR | 10-2015-0128015 A | 11/2015 |

OTHER PUBLICATIONS

European Search Report in corresponding European Application No. 16195706.3, dated Dec. 23, 2016, 6 pages.

*Primary Examiner* — Imran Akram
(74) *Attorney, Agent, or Firm* — Lewis Roca Rothgerber Christie LLP

(57) ABSTRACT

A battery module includes: a battery cell; a protective circuit module electrically coupled to the battery cell; a temperature sensitive element at the battery cell; a flexible printed circuit board having first and second end portions and an inner portion extending between the first and second end portions; and a spring. The protective circuit module includes a rigid printed circuit board. The flexible printed circuit board is fixed to a surface of the rigid printed circuit board facing the battery cell by the first and second end portions such that the inner portion forms a loop, is electrically connected to the protective circuit module and to the temperature sensitive element, and is centrally positioned on the inner portion of the flexible printed circuit board. The spring is arranged within the loop of the flexible printed circuit board such that the temperature sensitive element is pushed towards the battery cell.

10 Claims, 4 Drawing Sheets

(52) U.S. Cl.
CPC ........ *H01M 10/4257* (2013.01); *H05K 1/181* (2013.01); *B60L 11/187* (2013.01); *H01M 2010/4271* (2013.01); *H01M 2200/10* (2013.01); *H01M 2220/20* (2013.01); *H05K 2201/10037* (2013.01)

(58) Field of Classification Search
CPC ....... H01M 10/425; H05K 1/118; H05K 1/14; H05K 1/189; H05K 3/4691
See application file for complete search history.

(56) References Cited

U.S. PATENT DOCUMENTS

| | | | |
|---|---|---|---|
| 2009/0316351 A1* | 12/2009 | Zadesky | G06F 1/1626 361/679.33 |
| 2010/0092845 A1* | 4/2010 | Spare | H01M 2/1022 429/90 |
| 2011/0048781 A1* | 3/2011 | Neudecker | H01M 6/40 174/260 |
| 2013/0130757 A1* | 5/2013 | Luo | H04B 5/00 455/575.7 |
| 2013/0209846 A1 | 8/2013 | Lev et al. | |
| 2014/0176387 A1* | 6/2014 | Coles | H01Q 1/526 343/841 |
| 2014/0357949 A1* | 12/2014 | Wilson | A61B 1/041 600/109 |
| 2015/0072193 A1 | 3/2015 | Balk et al. | |
| 2015/0214583 A1 | 7/2015 | Lim et al. | |
| 2016/0344118 A1* | 11/2016 | Hsieh | H01R 43/16 |
| 2018/0084643 A1* | 3/2018 | Baxi | H05K 1/0283 |

* cited by examiner

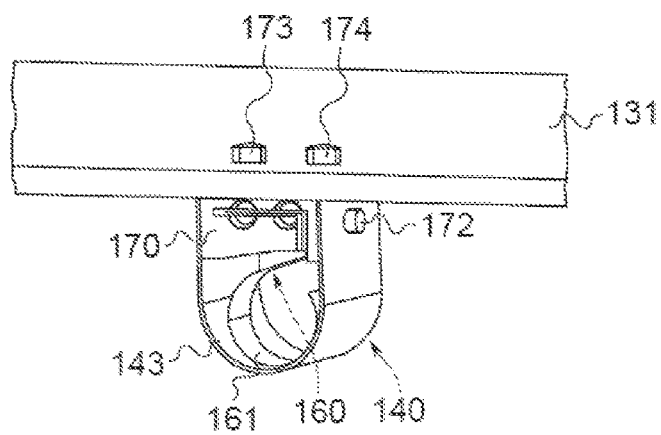
Fig. 4
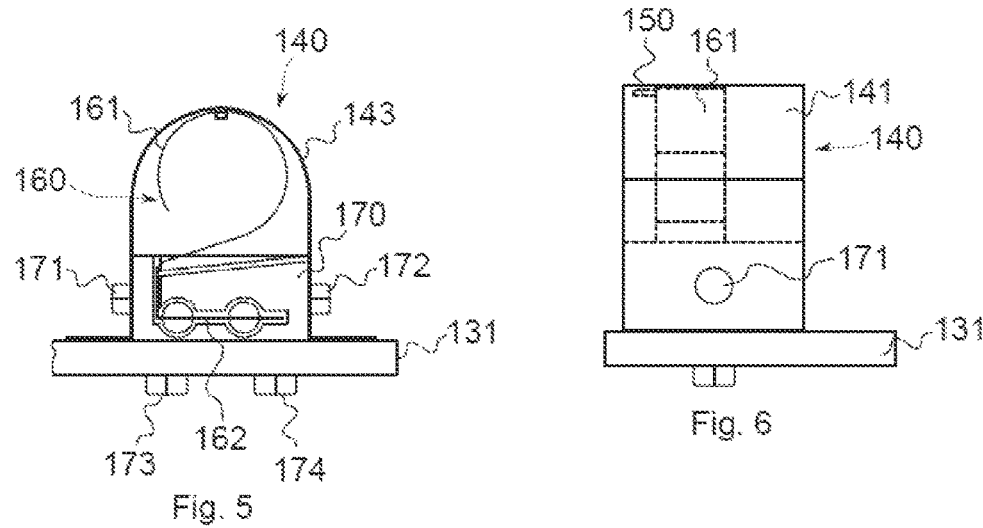
Fig. 5
Fig. 6
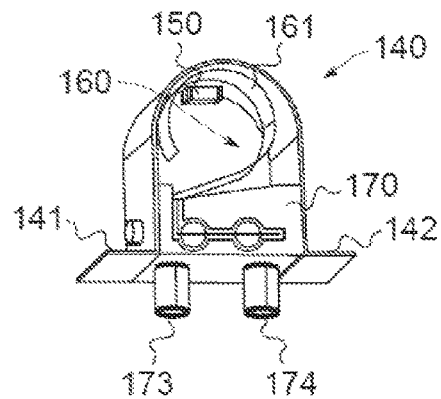
Fig. 7

BATTERY MODULE WITH A FIXTURE FOR A TEMPERATURE SENSITIVE ELEMENT

CROSS-REFERENCE TO RELATED APPLICATION

This application claims priority to and the benefit of European Patent Application No. 16195706.3, filed on Oct. 26, 2016 in the European Patent Office, the disclosure of which is incorporated herein by reference in its entirely.

BACKGROUND

1. Field

Aspects of embodiments of the present invention relate to a battery module including a fixture between a protective circuit module and a temperature sensitive element configured to measure a battery cell temperature.

2. Related Art

A rechargeable (or secondary) battery differs from a primary battery in that it is designed to be repeatedly charged and discharged, while the latter provides an irreversible conversion of chemical to electrical energy. Low-capacity rechargeable batteries are often used as power supplies for small electronic devices, such as cellular phones, notebook computers, and camcorders, while high-capacity rechargeable batteries are often used as power supplies for hybrid vehicles and the like.

Generally, rechargeable batteries include an electrode assembly including a positive electrode, a negative electrode, and a separator interposed between the positive and negative electrodes, a case receiving (or accommodating) the electrode assembly, and an electrode terminal electrically connected to the electrode assembly. An electrolyte solution is injected into the case to enable charging and discharging of the electrode assembly via an electrochemical reaction of the positive electrode, the negative electrode, and the electrolyte solution. The shape of the case, such as a cylindrical or rectangular shape, may be determined based on the intended purpose and/or application of the battery.

Rechargeable batteries (e.g., rechargeable unit battery cells) may be used as a part of a battery module including a plurality of the rechargeable unit battery cells coupled to each other in series and/or in parallel to provide relatively high energy density for, as one example, driving a motor of a hybrid vehicle. The battery module may be formed by interconnecting the electrode terminals of the plurality of unit battery cells, the number of unit battery cells depending on a desired amount of power, in order to provide a high-power rechargeable battery (e.g., a high-power rechargeable battery module) for, as one example, an electric vehicle.

Battery modules may have either a block design or a modular design. In the block design, each battery (e.g., each unit battery cell) is coupled to a common current collector (e.g., a common current collector structure) and to a common battery management system, and those components are arranged in a housing. In the modular design, pluralities of battery cells are connected to each other to form submodules, and several submodules are connected to each other to form the battery module. The battery management functions may then be at least partially realized on a module or submodule level and, thus, interchangeability may be improved compared to the block design. One or more battery modules are mechanically and electrically integrated, equipped with a thermal management system, and set up (or configured to) communicate with one or more electrical consumers to form a battery system. The thermal management system generally includes a protective circuit module that is arranged next to (e.g., adjacent to) the battery cells.

To meet the dynamic power demands of various electrical consumers connected to the battery system, static control of battery power output and charging is often insufficient. Thus, a steady exchange of information between the battery system and controllers of the electrical consumers may be employed. Such information includes the battery system's actual state of charge (SoC), potential electrical performance, charging ability, and internal resistance, as well as actual or predicted power demands or surpluses of the consumers. One parameter affecting the state of each battery cell is its cell temperature (e.g., the battery cell temperature). Therefore, temperature sensitive elements may be provided within the battery module. It is also important to ensure that the temperature sensitive element remains at (e.g., adjacent or in contact with) the surface of the battery cell, because, especially in automotive applications, there may be strong external impacts that could separate the temperature sensitive element from the surface of the battery cell. Generally, solutions to this problem include complex mechanical arrangements of fixtures with several parts, thereby significantly increasing the cost of the battery module due to high manufacturing and material costs.

For example, US 2015/0214583 A1 discloses a battery module including a plurality of battery cells aligned in one direction and a temperature sensor having a first surface contacting at least one battery cell of a plurality of battery cells to measure a temperature of the at least one battery cell. The battery module further includes a case configured to press against a second surface of the temperature sensor opposite to the first surface. The case includes a leaf spring pressing the temperature sensor in the direction of the battery cell.

Another example for ensuring close contact between a temperature sensor and a battery cell is disclosed in JP 5703458 B2.

SUMMARY

One or more of the drawbacks of the prior art may be avoided or at least mitigated according to aspects and features embodiments of the present invention.

According to one embodiment, a battery module includes: a battery cell; a protective circuit module electrically coupled to the battery cell and including a rigid printed circuit board; a temperature sensitive element at a surface of the battery cell; a flexible printed circuit board having a first end portion, a second end portion, and an inner portion extending between the first end portion and the second end portion. The flexible printed circuit board is fixed to a surface of the rigid printed circuit board facing the battery cell by the first end portion and the second end portion such that the inner portion forms a loop. The flexible printed circuit board is electrically connected the protective circuit module and the temperature sensitive element and is centrally positioned on the inner portion of the flexible printed circuit board. A spring element is arranged within the loop of the flexible printed circuit board such that the temperature sensitive element is pushed towards the battery cell.

Thus, one aspect of embodiments of the present invention is to provide a battery module in which a position and functionality of the temperature sensitive element at the surface of the battery cell is ensured even when relative movement of the battery cell and the protective circuit module occurs due to, for example, external impact. Furthermore, the manufacturing process remains simple to keep the manufacturing costs low. In some embodiments, this is achieved by arranging the temperature sensitive element on a loop of a flexible printed circuit board, which also establishes a sensing contact (e.g., an electrical connection) between the temperature sensitive element and the protective circuit module. Therefore, a spring element is positioned within the loop and pushes the temperature sensitive element against the battery cell such that the area bearing the temperature sensitive element is in close contact with the surface of the battery cell by a spring force.

A flexible circuit is an array of conductors bonded to a thin dielectric film. Flexible circuits require less manual labor during assembly and reduce production errors. Flexible circuits have an intrinsic ability to integrate form, fit, and function. Flexible circuits reduce or eliminate the high cost of routing, wrapping, and soldering wires. As a result, wiring errors are reduced or eliminated and manufacturing costs are reduced. However, rigid circuits provide higher component density, and as such, the protective circuit module may not be suitably established as a flexible printed circuit board. Hence, embodiments of the battery module according to the present invention combine the benefits of rigid and flexible circuits.

According to some embodiments, the spring element includes a rounded portion that lies against the inner portion of the flexible printed circuit board bearing the temperature sensitive element. For example, the spring element has a curved portion supporting the section of the flexible printed circuit board where the temperature sensitive element is arranged to be bent outwards. Thus, the temperature sensitive element comes into close contact with the battery cell when the protective circuit module is mounted onto the battery cells. Due to the spring force, the close contact is ensured even in case of external impacts and small relative movement of battery cell and the protective circuit module. Furthermore, the manufacturing process is simplified as there is no need to separately mount or fix the position of the temperature sensitive element(s). Contact between a wiring pattern of the rigid printed circuit board and the flexible printed circuit board may be easily established before these components are assembled with the battery cells and other parts of the battery module.

According to some embodiments, a lower part of the spring element is fixed by a bracket. In some embodiments, the bracket includes a first bolt at a first side surface of the bracket and a second bolt at a second side surface of the bracket. The flexible printed circuit board is tightly fixed to the bracket by the first and second bolts. Thus, the bracket is a rigid member positioned close to the rigid printed circuit board. The bracket accommodates and supports a lower part of the spring element. As such, the upper part of the spring element may not slip out of the loop of the flexible printed circuit board. Furthermore, in some embodiments, bolts on side surfaces of the bracket help to keep the loop in position such that the loop substantially extends perpendicular from the rigid printed circuit board of the protective circuit module. In addition, the manufacturing process is simplified because the flexible printed circuit board may be pre-mounted on the spring element and bracket, and electrical contact between the free end portions of the flexible printed circuit board and the rigid printed circuit board may be established by, for example, a soldering process.

The bracket may be fixed on the rigid printed circuit board. The bracket and the rigid printed circuit board may be connected by at least one form-locked connecting element. The form-locked connecting element may be a bolt provided at or, in other embodiments, as a part of (e.g., integral with), the bracket, and the rigid printed circuit board includes a corresponding opening to accommodate the bolt. Thus, the bracket includes a connecting device to ensure an accurate position of the temperature sensitive element on the protective circuit board. Using a form-locked connecting element simplifies the manufacturing process.

The bracket may be made of a plastic, such as a dielectric polymer. Thus, the fixture of the temperature sensitive element may be achieved by cost-effective compounds, such as a flexible printed circuit board, a spring element, and a bracket made of a relatively cheap material and having a simple mechanical constitution.

According to another aspect of the present invention, a vehicle including a battery module as defined above is provided. The vehicle may be an automobile.

According to embodiments of the present invention, at least some of the drawbacks of the prior art may be overcome or mitigated and a battery system that may be manufactured by a simple manufacturing process using non-expensive elements may be provided.

Further aspects of embodiments of the present invention will be learned from the dependent claims and the following description.

BRIEF DESCRIPTION OF THE DRAWINGS

Aspects and features of the present invention will become apparent to those of ordinary skill in the art by describing, in detail, exemplary embodiments thereof with reference to the attached drawings, in which:

FIGS. 4-6 are various enlarged perspective views of the fixture shown in FIG. 3;

FIG. 7 illustrates the fixture shown in FIG. 3 in an unmounted state;

DETAILED DESCRIPTION

Figure 1:
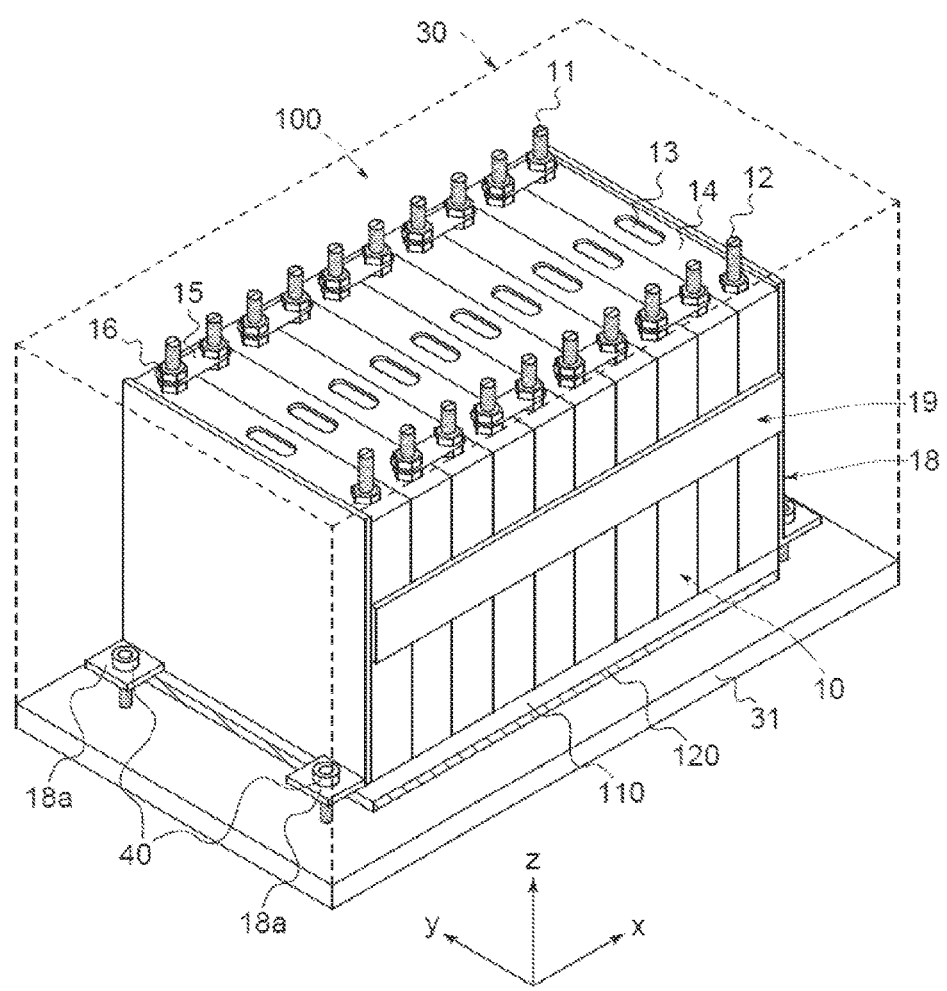
FIG. 1 is a perspective view of a battery module.

Aspects and features of the present invention and methods of accomplishing the same may be more readily understood by reference to the following detailed description of exemplary embodiments of the present invention and the accompanying drawings. Hereinafter, exemplary embodiments of the present invention will be described in more detail with reference to the accompanying drawings, in which like reference numbers refer to like elements throughout. The present invention, however, may be embodied in various different forms and should not be construed as being limited to only the embodiments illustrated herein. Rather, these embodiments are provided as examples so that this disclosure will be thorough and complete and will fully convey the aspects and features of the present invention to those skilled in the art. Accordingly, processes, elements, and techniques that are not necessary for the understanding of those having ordinary skill in the art may be omitted. Unless otherwise noted, like reference numerals denote like elements throughout the attached drawings and the written description, and thus, descriptions thereof may not be repeated. In the drawings, the relative sizes of elements, layers, and regions may be exaggerated for clarity.

Spatially relative terms, such as "beneath," "below," "lower," "under," "above," "upper," and the like, may be used herein for ease of explanation to describe one element or feature's relationship to another element(s) or feature(s) as illustrated in the figures. However, it will be understood that the spatially relative terms are intended to encompass different orientations of the device in use or in operation, in addition to the orientation depicted in the figures. For example, if the device in the figures is turned over, elements described as "below," "beneath," or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected to, or coupled to the other element or layer or one or more intervening elements or layers may be present. In addition, it will also be understood that when an element or layer is referred to as being "between" two elements or layers, it can be the only element or layer between the two elements or layers or one or more intervening elements or layers may also be present.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The semiconductor device and/or any other relevant devices or components according to embodiments of the present invention described herein may be implemented utilizing any suitable hardware, firmware (e.g., an application-specific integrated circuit), software, and/or a suitable combination of software, firmware, and hardware. For example, the various components of the semiconductor device may be formed on one integrated circuit (IC) chip or on separate IC chips. Further, the various components of the semiconductor device may be implemented on a flexible printed circuit film, a tape carrier package (TCP), a printed circuit board (PCB), or formed on a same substrate as the semiconductor device. Further, the various components of the semiconductor device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device or the functionality of a particular computing device may be distributed across one or more other computing devices without departing from the scope of the exemplary embodiments of the present invention.

Referring to FIG. 1, a conventional battery module 100 includes a plurality of battery cells 10 aligned in one direction and a heat exchange member 110 (e.g., a heat exchanger) provided adjacent to a bottom surface of the plurality of battery cells 10. A pair of end plates 18 is provided to face wide surfaces of the outermost ones of the battery cells 10, and a connection plate 19 is configured to connect the pair of end plates 18 to each other, thereby fixing the plurality of battery cells 10 together. An additional connection plate 19 may be included at a side of the battery cells 10 opposite to the illustrated connection plate 19. The end plates 18 on both sides of the battery module 100 are fastened to a support plate 31 by bolts 40 extending through fastening portions 18a of the end plates 18. The support plate 31 is part of a housing 30. In addition, an elastic member 120 made of rubber or other elastic materials may be interposed between the support plate 31 and the heat exchange member 110.

Here, each battery cell 10 is a prismatic (or rectangular) cell, and the wide flat surfaces of the battery cells 10 are stacked together (e.g., stacked facing each other) to form the battery module. Further, each battery cell 10 includes a battery case to accommodate an electrode assembly and an electrolyte. The battery case is hermetically sealed by a cap assembly 14. The cap assembly 14 is provided with positive and negative electrode terminals 11, 12 having different polarities from each other and a vent 13. The vent 13 is a safety device of the battery cell 10 and acts as a passage through which gas generated in the battery cell 10 is exhausted to the outside of the battery cell 10. The positive and negative electrode terminals 11, 12 of neighboring battery cells 10 are electrically connected to each other through a bus bar 15, and the bus bar 15 may be fixed by a nut 16 or the like. The battery module 100 may be used as power source unit by electrically connecting the plurality of battery cells 10 to each other as one bundle. Rechargeable secondary batteries, for example, lithium secondary batteries, may be used as the battery cells 10. The battery module 100 may be a 48V battery (e.g., a 48V battery module) for automotive applications.

Generally, the battery cells 10 generate a large amount of heat while being charged/discharged. The generated heat is accumulated in the battery cells 10, thereby accelerating the deterioration of the battery cells 10. Therefore, the battery module 100 includes the heat exchange member 110, which is provided adjacent to the bottom surface of the battery cells 10, to cool the battery cells 10. Furthermore, the battery module 100 detects the temperature of the battery cells 10 (e.g., includes a device configured to detect the temperature of the battery cells 10) in order to safely operate the battery module 100. Such devices include a protective circuit module and temperature sensors.

Figure 2:
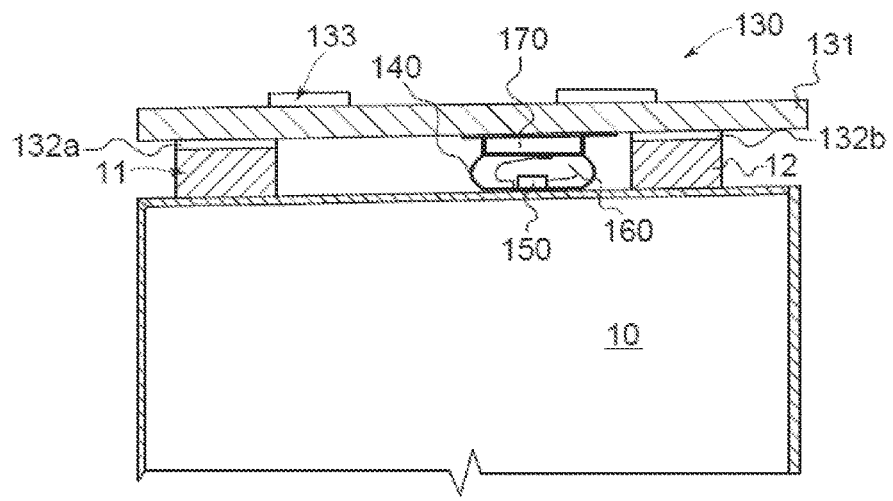
FIG. 2 is a partially cut-away cross-sectional view of a part of a battery module including a fixture for a temperature sensitive element according to an embodiment of the present invention.

FIG. 2 is a partially cut-away cross-sectional view of one of the battery cells 10 of a battery module according to an embodiment of the present invention. Referring to FIG. 2, the battery module includes a protective circuit module 130 electrically connected to the battery cell 10. Furthermore, the protective circuit module 130 is electrically connected to a temperature sensitive element 150 via a flexible printed circuit board 140.

In general, each battery cell 10 of the battery module is electrically connected to the protective circuit module 130. According to the present embodiment, all of the battery cells 10 of the battery module are connected to one protective circuit module 130. However, in other embodiments, two or more separate protective circuit modules may be connected to a group of battery cells or single battery cells.

The protective circuit module 130 is arranged above sides of the battery cells 10 (e.g., upper surfaces of the battery cells 10) such that there is a gap between the battery cell surface and the side of the protective circuit module 130 facing the battery cells 10. In the illustrated embodiment, the protective circuit module 130 is arranged at the upper surface of the battery cells 10 bearing the electrode terminals 11, 12. For example, the protective circuit module 130 is electrically connected to the battery cells 10 to control charging and discharging and to prevent the battery cells 10 from being over-charged or over-discharged.

The protective circuit module 130 includes a rigid printed circuit board (PCB) 131 with connection terminals 132a, 132b to be connected to the terminals 11, 12 of the battery cell 10, respectively, and at least one semiconductor device 133 on an upper surface of the circuit board 131. The semiconductor device 133 may include an integrated circuit that is adapted or configured to compare the measured temperature of the battery cell 10 with a limit value of allowable battery cell temperatures. The circuit board 131 includes a wiring pattern formed on a surface of the circuit board 131. A main body of the circuit board 131 may be formed of a rigid electrically insulating material, such as polyimide (PI) and/or polyethylene (PET). The wiring pattern may be made of an electrically conductive material, such as copper (Cu), titanium (Ti), nickel (Ni), and/or palladium (Pd).

The connection terminals 132a, 132b may be formed by exposing a portion of the wiring pattern or by providing a conductive material, such as gold (Au), on the exposed portion of the wiring pattern.

The semiconductor device 133 applies (or generates) signals for controlling operations of the battery cells 10. For example, the semiconductor device 133 controls charging and/or discharging of the battery cells 10 through high current lines connected to the battery cells 10. As another example, the semiconductor device 133 applies (or analyzes) signals indicating voltages, current, and temperatures of the battery cells 10 to prevent, for example, over-charge and/or over-discharge of the battery cells 10.

To provide these features, the semiconductor device 133 applies (or analyzes) information about the temperatures of the battery cells 10 via (e.g., received via) the flexible printed circuit board 140 from the temperature sensitive element 150 and controls the operations of the battery cells 10. Here, the information about the voltages, currents, and temperatures may be transferred to the semiconductor device 133 through the wiring pattern of the circuit board 131.

The flexible printed circuit board 140 connects the protective circuit module 130 and the temperature sensitive element 150 provided at a surface of the battery cell 10 to each other. According to one embodiment, each battery cell 10 of the battery module includes at least one temperature sensitive element 150 in order to separately measure the temperature of each battery cell 10. However, in other embodiments, it may be sufficient to arrange two or more temperature sensitive elements 150 (e.g., fewer temperature sensitive elements 150 than battery cells 10) in the battery module.

The flexible printed circuit board 140 includes sensing lines for transmitting signals from the connected temperature sensitive element 150 to the protective circuit module 130, thereby allowing the protective circuit module 130 to identify temperature values of the corresponding battery cell 10. The flexible printed circuit board 140 extends between the protective circuit module 130 and the temperature sensitive element 150. Because the flexible printed circuit board 140 is easily bent, a stable connection is maintained between the both components even when the battery cells 10 and/or the protective circuit module 130 moves within the housing 30.

Further aspects of the fixture for the temperature sensitive element 150 will now be described with respect to the embodiment illustrated in FIG. 3.

The flexible printed circuit board 140 includes a first end portion 141, a second end portion 142, and an inner portion 143 connecting the first end portion 141 and the second end portion 142 to each other (e.g., the inner portion 143 extends between the first end portion 141 and the second end portion 142). The flexible printed circuit board 140 is fixed to a surface of the rigid printed circuit board 131 facing the battery cell 10 by the first end portion 141 and the second end portion 142 such that the inner portion 143 forms a loop. The flexible printed circuit board 140 electrically connects the protective circuit module 130 and the temperature sensitive element 150 to each other. In some embodiments, there may be connectors at the rigid printed circuit board 131 where the end portions 141, 142 is connected thereto such that the end portions 141, 142 may be coupled to a wiring pattern by, for example, a soldering process or the like. The temperature sensitive element 150 is centrally positioned on the inner portion 143 of the flexible printed circuit board 140. In the illustrated embodiment, the temperature sensitive element 150 is provided at an inner surface of the flexible printed circuit board 140. However, in other embodiments, the temperature sensitive element 150 may be provided at the outer surface of the flexible printed circuit board 140 or may be integrated into the flexible printed circuit board 140. The fixture further includes a spring element 160 (e.g., a spring) arranged within the loop of the flexible printed circuit board 140 such that the temperature sensitive element 150 is pushed towards the battery cell 10.

The temperature sensitive element 150 may be a temperature sensor, for example, a negative temperature coefficient (NTC) thermistor, the electrical resistance value of which decreases due to a negative temperature coefficient as the temperature of the battery cells 10 increases, or a positive temperature coefficient (PTC) thermistor, the electrical resistance value of which increases as the temperature of the battery cells 10 increases. Because the temperature sensitive element 150 sensitively reacts to temperature and alters resistance values with or according to temperature, the protective circuit module 130 may control charging and discharging of the battery cells 10 (e.g., may control charging and discharging of the battery cells 10 according to the value of the temperature sensitive element 150).

For example, the temperature sensitive element 150 may be provided as a chip thermistor. Because the chip thermistor is simply connected to the circuit board 131 of the protective circuit module 130 via the flexible printed circuit board 140 by, for example, a solder mounting process, the number of overall process steps can be reduced. In addition, such solder mounting can be automated.

To hold the temperature sensitive element 150 at the upper surface of the battery cell 10, the spring element 160 is provided within the loop of the flexible printed circuit board 140. Thus, the temperature sensitive element 150 is pressed on the top side (e.g., the upper surface) of the battery cell 10 by the spring element 160. For example, the spring element 160 includes a rounded portion 161 that lies against the inner portion 143 of the flexible printed circuit board 140 bearing the temperature sensitive element 150. In the illustrated embodiment, the spring element 160 is a leaf spring, but the present invention is not limited thereto.

Figure 3:
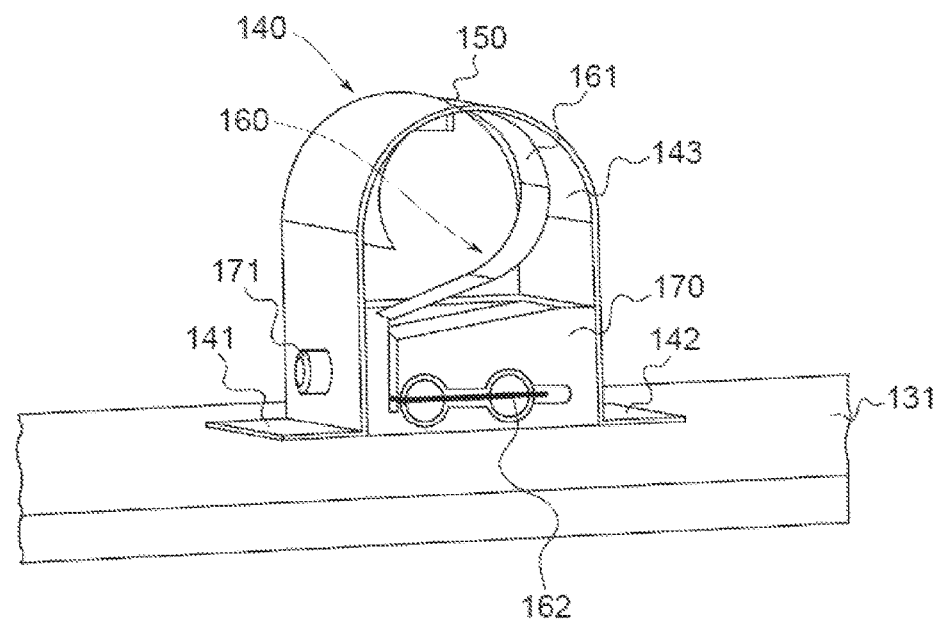
FIG. 3 is an enlarged perspective view of a fixture for a temperature sensitive element according to another embodiment of the present invention.

The fixture of the embodiment illustrated in FIG. 3 further includes a bracket 170. A lower part 162 of the spring element 160 is fixed by the bracket 170. Thus, the bracket 170 forms a rigid holder for the spring element 160. The bracket 170 may be formed of plastic, such as a dielectric polymer. During the manufacturing process, the spring element 160 is placed into the plastic bracket 170 and fixed by, for example, hot stamping.

FIGS. 4-6 illustrate the embodiment shown in FIG. 3 from different perspectives, and FIG. 7 shows the embodiment without the rigid printed circuit board 131. The bracket 170 further includes a first bolt 171 provided at a first side surface of the bracket 170 and a second bolt 172 provided at a second side surface of the bracket 170 opposite to the first side surface. The flexible printed circuit board 140 is tightly fixed at the first and second bolts 171, 172 on the bracket 170. The flexible printed circuit board 140 includes corresponding opening 144, 145 (e.g., holes) which are illustrated, in more detail, in FIG. 9. During the manufacturing process, the flexible printed circuit board 140 may be placed on the spring element 160 such that the bolts 171, 172 reach through the openings 144, 145 and the flexible printed circuit board 140 is tightened thereto. The bolts 171, 172 may be hot stamped to permanently maintain their position.

The bracket 170 is fixed on the rigid printed circuit board 131. In the illustrated embodiment, the bracket 170 is connected to the rigid printed circuit board 131 by a plurality of (e.g., two) form-locked connecting elements. For example, in one embodiment, the form-locked connecting elements are bolts 173, 174 provided at a lower surface of the bracket 170 and are integral therewith. The rigid printed circuit board 131 includes corresponding openings (e.g., holes) to accommodate the bolts 173, 174. The bolts 173, 174 may be hot stamped to permanently maintain their position.

Figure 8:
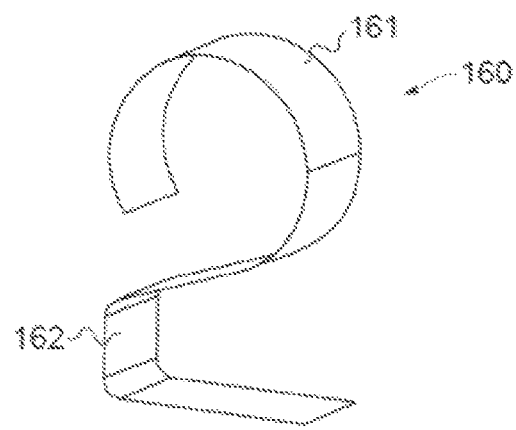
FIG. 8 illustrates a spring element of the fixture according to the embodiment shown in FIG. 3.

FIG. 8 is a perspective view of the spring element 160 shown in FIG. 3. The upper part (or the rounded portion) 161 of the spring element 160 has a rounded contour, and the lower part 162 of the spring element 160 is placed in the bracket 170. The spring element 160 may be a band of stainless steel. The spring element 160 may have a width of, for example, about 6 mm and a high of, for example, about 10 mm.

In some embodiments, a width of the band of the spring element 160 is less than a width of the flexible printed circuit board 140. Thus, the flexible printed circuit board 140 may be arranged such that the spring element 160 does not touch the temperature sensitive element 150 in order to avoid any damage thereto. The temperature sensitive element 150 may be provided at an edge of the flexible printed circuit board 140 as illustrated in FIG. 9.

Figure 9:
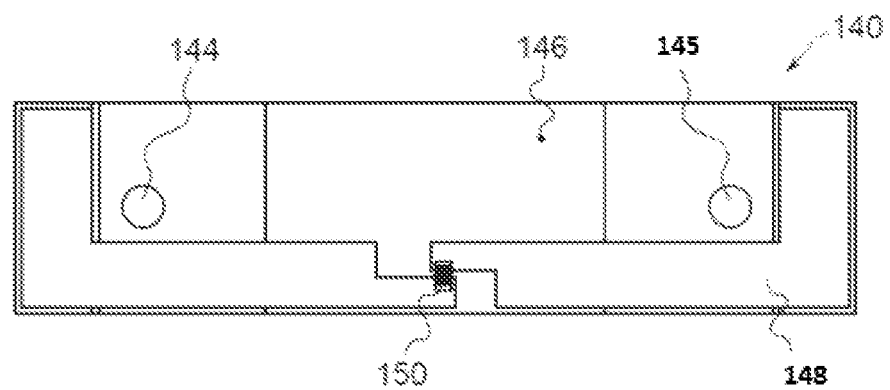
FIG. 9 is a plan view of a flexible printed circuit board of the fixture according to the embodiment shown in FIG. 3.
Figure 10:
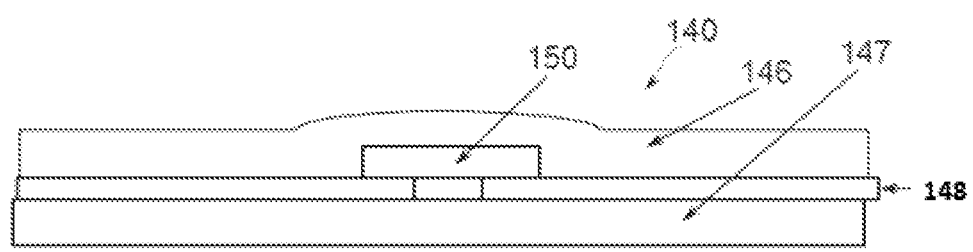
FIG. 10 is a partial cross-sectional view of the flexible printed circuit board shown in FIG. 9.

FIG. 9 is a schematically and partially cut-away plan view of the flexible printed circuit board 140, and FIG. 10 is a partial cross-sectional view thereof. The flexible printed circuit board 140 includes an electrically conducting layer 148 made of, for example, copper (Cu), which is embedded in between two dielectric layers 146, 147. The temperature sensitive element 150 bypasses (e.g., extends between) electrically separated parts of the conducting layer 148. Thus, the temperature sensitive element 150 may be, for example, an NTC thermistor.

What is claimed is:
1. A battery module comprising:
 a battery cell;
 a protective circuit module electrically coupled to the battery cell and comprising a rigid printed circuit board;
 a temperature sensitive element at a surface of the battery cell;
 a flexible printed circuit board having a first end portion, a second end portion, and an inner portion extending between the first end portion and the second end portion, the flexible printed circuit board being fixed to a surface of the rigid printed circuit board facing the battery cell by the first end portion and the second end portion such that the inner portion forms a loop, being electrically connected to the protective circuit module and to the temperature sensitive element, and being centrally positioned on the inner portion of the flexible printed circuit board; and
 a spring arranged within the loop of the flexible printed circuit board such that the temperature sensitive element is pushed towards the battery cell.

2. The battery module of claim 1, wherein the spring has a rounded portion that lies against the inner portion of the flexible printed circuit board bearing the temperature sensitive element.

3. The battery module of claim 1, further comprising a bracket fixing a lower part of the spring.

4. The battery module of claim 3, wherein the bracket comprises a first bolt at a first side surface of the bracket and a second bolt at a second side surface of the bracket, and
   wherein the flexible printed circuit board is rigidly fixed to the bracket by the first and second bolts.

5. The battery module of claim 4, wherein the flexible printed circuit board has a plurality openings corresponding to the first and second bolts.

6. The battery module of claim 3, wherein the bracket is fixed on the rigid printed circuit board.

7. The battery module of claim 6, wherein the bracket and the rigid printed circuit board are connected by a form-locked connecting element.

8. The battery module of claim 7, wherein the form-locked connecting element is a bolt at the bracket and,
   wherein the rigid printed circuit board has a corresponding opening to accommodate the bolt.

9. The battery module of claim 3, wherein the bracket comprises plastic.

10. A vehicle comprising the battery module according to claim 1.

* * * * *